United States Patent [19]
Czernuszka et al.

[11] Patent Number: 5,256,877
[45] Date of Patent: Oct. 26, 1993

[54] METHOD AND APPARATUS FOR IMAGING DISLOCATIONS IN MATERIALS USING A SCANNING ELECTRON MICROSCOPE

[75] Inventors: Jan T. Czernuszka; Neil J. Long, both of Oxford, England

[73] Assignee: Isis Innovation Limited, Oxford, England

[21] Appl. No.: 894,764

[22] Filed: May 7, 1992

[51] Int. Cl.$^5$ .............................................. H01V 37/28
[52] U.S. Cl. ...................... 250/310; 250/307; 250/397
[58] Field of Search .................. 250/310, 307, 397

[56] References Cited

U.S. PATENT DOCUMENTS

| | | | |
|---|---|---|---|
| 2,281,325 | 3/1942 | Ramo | 250/49.5 |
| 4,238,686 | 9/1980 | Chin et al. | 250/492 |
| 4,665,513 | 10/1987 | Wells | 250/306 |
| 4,724,320 | 7/1988 | Ino et al. | 250/307 |
| 5,093,573 | 3/1992 | Mikoshiba et al. | 250/310 |
| 5,198,675 | 3/1993 | Hikita et al. | 250/397 |

FOREIGN PATENT DOCUMENTS

| | | |
|---|---|---|
| 1248201 | 3/1972 | United Kingdom . |
| 1290743 | 9/1972 | United Kingdom . |
| 2052147A | 6/1987 | United Kingdom . |

*Primary Examiner*—Jack I. Berman
*Attorney, Agent, or Firm*—Nixon & Vanderhye

[57] ABSTRACT

Apparatus for imaging dislocations in materials using a scanning electron microscope and in which an electron detector is placed very close to the specimen being examined, without the intervention of a retarding field filter; low-loss electrons are collected by ensuring that the detector accepts electrons received from the specimen at an obtuse angle with respect to the incident electron beam; and an image enhancement system is used.

3 Claims, 1 Drawing Sheet

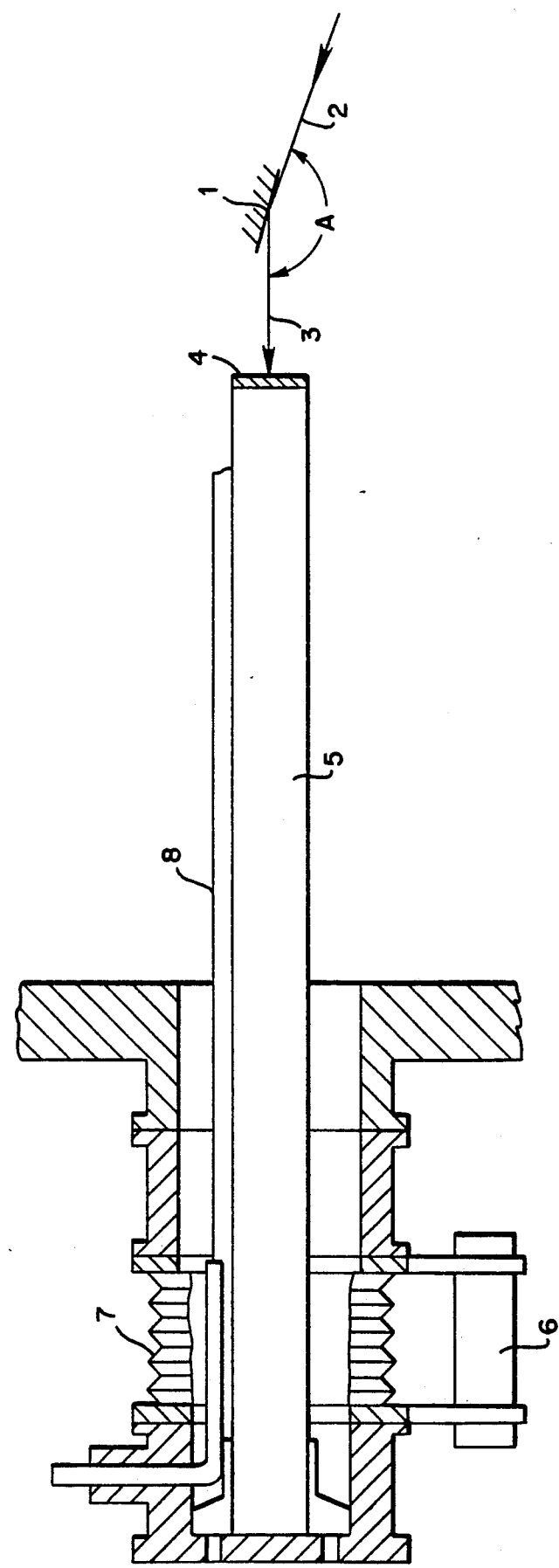

METHOD AND APPARATUS FOR IMAGING DISLOCATIONS IN MATERIALS USING A SCANNING ELECTRON MICROSCOPE

The invention relates to a method and apparatus for imaging dislocations in materials, particularly near-surface dislocations in bulk materials.

In 1979 Morin et al (P. Morin, M. Pitaval, D. Besnard, G. Fonataine-Philos. Mag. (1079) A40 511–524) showed that it was possible to image dislocations in bulk silicon specimens. Their equipment consisted of a Stereoscan MkII scanning electron microscope (SEM) fitted with a filed emission gun (FEG) operating at up to 50 kV. The back-scattered signal was collected on a scintillator with a collection angle of 45 degrees. A retarding field filter was used so that only electrons which had lost little energy would be collected (i.e. those which had suffered few collisions and so came from very near the specimen surface). The retarding field filter also provided focusing of electrons on to the relatively small scintillator. Their results suggested that the explored depth beneath the surface is ~100 nm and the resolution of the technique is ~10 nm. Their beam divergence was 2.5 milliradians and a spot size of 5 nm.

The Morin system had the severe practical disadvantage that it required a standard electron microscope to be modified in such a way as to be effectively unusable for other purposes. In a scanning electron microscope and more particularly a modern FEG scanning transmission electron microscope (STEM) there is a very limited amount of space available in the neighborhood of the specimen stage. The retarding field filter is bulky and requires voltage supply leads with the need for insulation space. The filter was necessary because it rejected lower energy electrons which contributed to background noise and thus enhanced contrast to an acceptable level from the unusable 1% or so of the raw signal. In order to use the imaging technique without total dedication of an electron microscope the problem was seen as devising a scintillator/filter assembly of size sufficiently small and of retractable design. This presented severe difficulties and no solution was proposed. However, by adopting an alternative approach the present invention has provided a solution.

Apparatus for imaging dislocations in materials comprising a scanning electron microscope with a field emission electron gun; a tiltable specimen stage for holding a specimen in the electron beam; a probe for receiving electrons back-scattered from a specimen at the specimen stage, the probe comprising a scintillator screen, a light guide coupled to the screen and no retarding field filter, the screen being positioned so as to accept primary electrons which are back-scattered to travel from the specimen at an obtuse angle with respect to the incident electron beam and which have lost little of their initial energy; translation means for advancing the probe to the immediate proximity of the specimen and for retracting the probe; a photomultiplier coupled to the light guide and an electron image enhancement system connected to the photomultiplier and to the microscope scanning system so as to produce an enhanced image of near-surface dislocations in the specimen.

It is found that in the limited space available in an electron microscope advantage can be derived in providing a scintillator screen of as great a diameter as is physically possible, sacrificing the focusing and contrast enhancement facilities provided by a retarding field filter, and placing the screen very close to the specimen. The geometry of the detector in relation to the electron beam and the specimen is such the detector is optimised to collect those electrons which have lost little of their initial energy. It is precisely these low loss electrons which contain the valuable signal. Placing the screen close to the specimen allows the optimisation of the low loss signal for a range of specimen tilts. The use of electronic image enhancement techniques allows the advantages of the additional collected information to outweigh the reduced contrast in the raw signal.

It is a feature of the invention that the detector is positioned so as to accept electrons which make an obtuse angle with the incident beam direction, so as to detect those scattered electrons making a small angle with the specimen surface. For the avoidance of doubt it is pointed out that specularly reflected electrons are not scattered. The angle of the specimen surface is found to be critical. Much valuable information can be derived by examining the same portion of the specimen is slightly different angles. In this way surface features can be distinguished from near-surface features such as dislocations. Thus, it is a feature of the invention that the specimen stage is tiltable, preferably not about one axis but about two orthogonal axes.

In accordance with other aspects of the invention there is provided a method of examining a specimen for near-surface dislocations which consists in employing the apparatus in accordance with the invention to image dislocations with the specimen surface at a first angle, tilting the specimen to image the dislocations at one or more angles and comparing the images.

BRIEF DESCRIPTION OF THE DRAWING

The invention will further be described with reference to the accompanying drawing, the sole figure of which is a schematic cross-sectional side elevation of apparatus embodying the invention.

Referring to the drawing, there is shown a part of a field emission gun scanning electron microscope which is operated over a range of voltages between 30 kV and 100 kV. A single tilt cartridge holds a specimen 1 in a specimen stage. The incident electron beam from the gun is shown at 2 impinging on the specimen. This gives rise to back-scattered electrons 3 which impinge on a scintillator screen 4. Screen 4 is 12 mm yttrium aluminium garnet (YAG) screen and it is coupled to a cylindrical glass light guide 5 of the same diameter. In practice, the guide 5 is shaped to avoid contact with scanning coils etc. The other end of the light guide is optically coupled through a zero length window to a photomultiplier tube (PMT - not shown).

The assembly of screen and light guide, which may be regarded as a probe, is translatable linearly by means of a transfer mechanism 6. Bellows 7 allow movement while retaining the operating vacuum. The probe is ultra-high-vacuum compatible and a high voltage lead 8 is connected to the tip of the probe to allow voltage to be applied.

The disposition of the probe with respect to the specimen and the incident electron beam is arranged to ensure that low loss electrons are detected. This means that the electrons collected by the probe should come from the specimen at an obtuse angle A with respect to the incident electron beam.

The screen can be positioned as close to the specimen as desired to increase the collection angle up to 160 degrees. By retracting the assembly the microscope can be used in its normal modes without impairing its use. The signal is fed from the PMT to a Synoptics image enhancement package. The final image is obtained by one of two routes: either the raw signal is processed with a Kalman averaging program, or, with the PMT in pulse mode, electron counting can be performed.

The specimen is a (111) section taken from a Si sample compressed for single slip. It is fixed to a stub which is 4 degrees off horizontal with the tilt axis along [$\bar{1}10$]. The specimen is placed in the upper (SEM) position of the microscope.

The invention is not restricted to the details of the embodiment described above with reference to the drawings. For example, the light guide may comprise a light-fiber bundle which allows the additional provision of an image of the spatial distribution of the incidence of electrons on the screen.

We claim:

1. Apparatus for imaging dislocations in materials comprising a scanning electron microscope with a field emission electron gun; a tiltable specimen stage for holding a specimen in the electron beam; a probe for receiving electrons back-scattered from a specimen at the specimen stage, the probe comprising a scintillator screen, a light guide coupled to the screen and no retarding field filter, the screen being positioned so as to accept primary electrons which are back-scattered to travel from the specimen at an obtuse angle with respect to the incident electron beam and which have lost little of their initial energy; translation means for advancing the probe to the immediate proximity of the specimen and for retracting the probe; a photomultiplier coupled to the light guide and an electron image enhancement system connected to the photomultiplier and to the microscope scanning system so as to produce an enhanced image of near-surface dislocations in the specimen.

2. Apparatus as claimed in claim 1 wherein the specimen stage is tiltable about two orthogonal axes.

3. A method of examining a specimen for near-surface dislocations which consists in employing the apparatus according to either of the preceding claims to image dislocations with the specimen surface at a first angle, tilting the specimen to image the dislocations at one or more other angles and comparing the images.

* * * * *